(12) United States Patent
Otakeguchi

(10) Patent No.: US 11,847,004 B2
(45) Date of Patent: Dec. 19, 2023

(54) ELECTRONIC DEVICE SYSTEM INCLUDING A PLURALITY OF ELECTRONIC DEVICES AND A CONTROL DEVICE CONNECTED TO THE PLURALITY OF ELECTRONIC DEVICES ADDRESSING VARIATIONS DUE TO CLOCK VARIATIONS IN EACH ELECTRONIC DEVICE

(71) Applicant: JVCKENWOOD CORPORATION, Yokohama (JP)

(72) Inventor: Hirofumi Otakeguchi, Yokohama (JP)

(73) Assignee: JVCKENWOOD CORPORATION, Yokohama (JP)

( * ) Notice: Subject to any disclaimer, the term of this patent is extended or adjusted under 35 U.S.C. 154(b) by 0 days.

(21) Appl. No.: 17/752,593

(22) Filed: May 24, 2022

(65) Prior Publication Data

US 2022/0382349 A1 Dec. 1, 2022

(30) Foreign Application Priority Data

May 27, 2021 (JP) ................................ 2021-089209

(51) Int. Cl.
*G06F 1/26* (2006.01)
*H03K 17/60* (2006.01)

(52) U.S. Cl.
CPC ............... *G06F 1/26* (2013.01); *H03K 17/60* (2013.01)

(58) Field of Classification Search
None
See application file for complete search history.

(56) References Cited

U.S. PATENT DOCUMENTS

| 6,107,847 A | * | 8/2000 | Johnson | H03K 17/223 327/143 |
| 2003/0237008 A1 | * | 12/2003 | Freevol | G06F 1/329 713/300 |
| 2006/0107077 A1 | * | 5/2006 | Roth | G06F 1/3243 712/E9.024 |
| 2011/0241741 A1 | * | 10/2011 | Millendorf | G06F 1/24 700/121 |
| 2015/0095537 A1 | * | 4/2015 | Sengoku | G06F 1/3253 710/110 |
| 2018/0052791 A1 | * | 2/2018 | Srivastava | G06F 1/3296 |
| 2020/0393891 A1 | * | 12/2020 | Baggett | H04L 12/40039 |

FOREIGN PATENT DOCUMENTS

JP H6-225452 A 8/1994

* cited by examiner

*Primary Examiner* — Danny Chan
(74) *Attorney, Agent, or Firm* — Nath, Goldberg & Meyer; Jerald L. Meyer; Stanley N. Protigal

(57) ABSTRACT

An electronic device includes a hold circuit and a microcomputer. The hold circuit is connected to a power control line from a control device. The microcomputer starts measuring the time of a second state when the power control line transitions from a first state to the second state due to the control device. The microcomputer controls a power supply circuit to turn on power when the second state continues for a first predetermined time, and operates the hold circuit to maintain the power control line in the second state for a second predetermined time after the first predetermined time has elapsed.

4 Claims, 8 Drawing Sheets

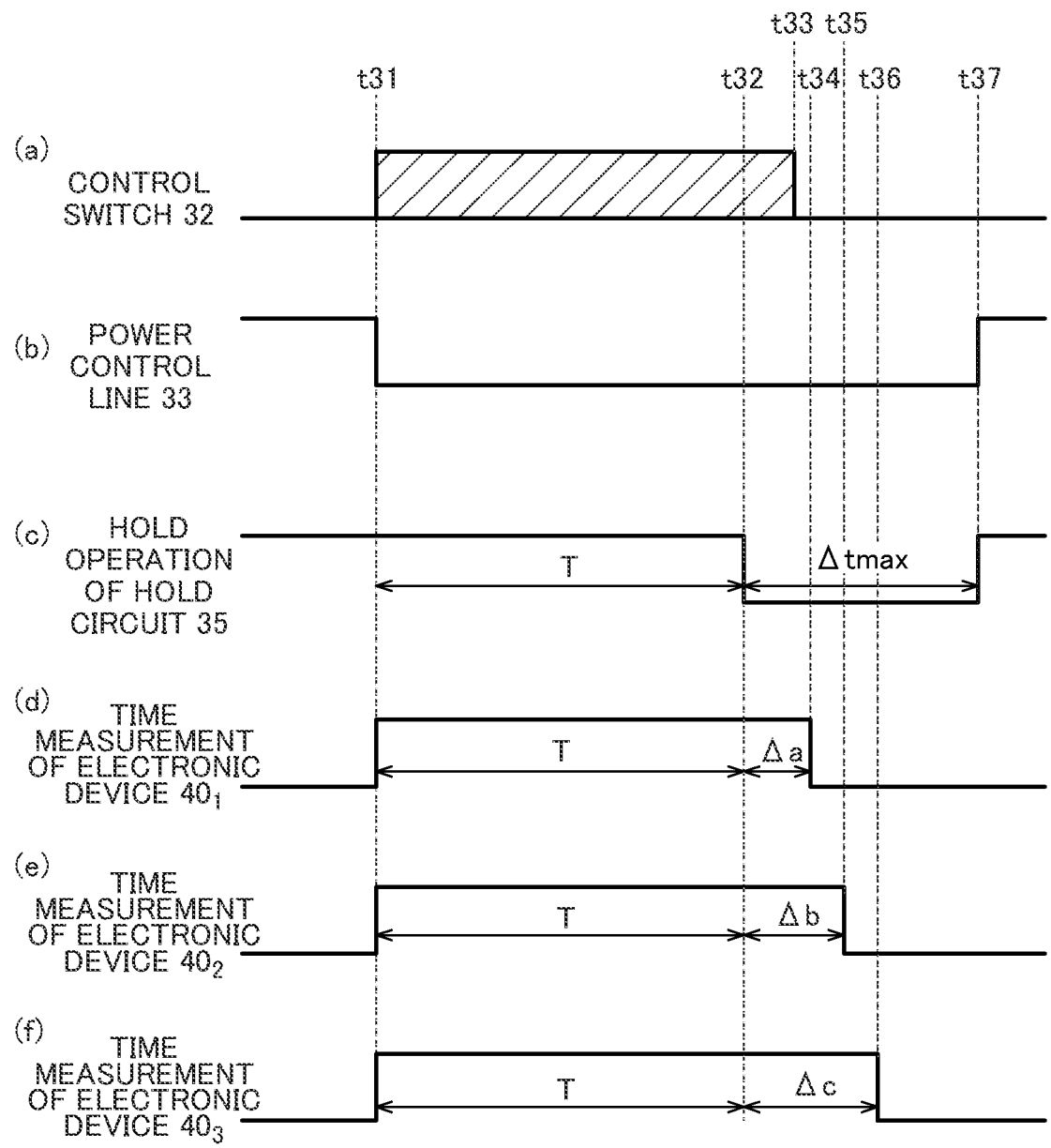

ELECTRONIC DEVICE SYSTEM INCLUDING A PLURALITY OF ELECTRONIC DEVICES AND A CONTROL DEVICE CONNECTED TO THE PLURALITY OF ELECTRONIC DEVICES ADDRESSING VARIATIONS DUE TO CLOCK VARIATIONS IN EACH ELECTRONIC DEVICE

CROSS REFERENCE TO RELATED APPLICATION

This application is based upon and claims the benefit of priority under 35 U.S.C. § 119 from Japanese Patent Application. No. 2021-089209 filed on May 27, 2021, the entire contents of which are incorporated herein by reference.

BACKGROUND

The present disclosure relates to an electronic device and an electronic device system.

There is an electronic device system configured to turn on the power of all of a plurality of electronic devices due to a control switch provided in a control device commonly connected to the electronic devices being pressed. As a technique related to this type of electronic device system, Japanese Unexamined Patent Application Publication. No. 6-225452 describes that the power of a plurality of devices is turned on in a predetermined order due to a single switch being pressed.

In the electronic device system described above, each electronic device may be configured to turn itself on when it detects that the control switch has been pressed and held for a predetermined time or longer, a long press of the control switch so to speak.

SUMMARY

Each electronic device uses a built-in clock to determine whether or not the control switch has been pressed and held for a predetermined time or longer. Since the clocks in each electronic device are usually not synchronized and operate independently, the timing for determining whether or not the control switch has been pressed and held for a predetermined time or longer varies. Depending on the timing at which the user releases the control switch, some of the electronic devices among the plurality of electronic devices may turn on and start up, while some other electronic devices may not.

A first aspect of one or more embodiments provides an electronic device including: a hold circuit connected to a power control line from a control device that performs control to turn on power of a plurality of electronic devices; a microcomputer configured to start measuring a time of a second state when the power control line transitions from a first state to the second state due to the control device, to turn on power when the second state continues for a first predetermined time, and to operate the hold circuit to maintain the power control line in the second state for a second predetermined time after the first predetermined time has elapsed.

A second aspect of one or more embodiments provides an electronic device system including: a plurality of electronic devices; and a control device connected to the plurality of electronic devices by a power control line, and including a control switch for transitioning the power control line from a first state to a second state, wherein each electronic device of the plurality of electronic devices includes: a hold circuit connected to the power control line; and a microcomputer configured to start measuring a time of the second state when the power control line transitions from the first state to the second state, to turn on power when the second state continues for a first predetermined time, and to operate the hold circuit to maintain the power control line in the second state for a second predetermined time after the first predetermined time has elapsed.

A third aspect of one or more embodiments provides an electronic device system including: a plurality of electronic devices; and a control device connected to the plurality of electronic devices by a power control line, wherein the control device includes: a control switch for transitioning the power control line from a first state to a second state; a hold circuit connected to the power control line; and a first microcomputer configured to start measuring a time of the second state when the power control line transitions from the first state to the second state, and, when the second state continues for a first predetermined time, to operate the hold circuit to maintain the power control line in the second state for a second predetermined time after the first predetermined time has elapsed, and each electronic device of the plurality of electronic devices includes a second microcomputer configured to start measuring a time of the second state when the power control line transitions from the first state to the second state, and to turn on power after the first predetermined time has elapsed.

BRIEF DESCRIPTION OF THE DRAWINGS

FIG. 8 is a timing chart illustrating an example of the operation of the electronic device and the electronic device system according to a fourth embodiment.

DETAILED DESCRIPTION

Hereinafter, an electronic device and an electronic device system according to each embodiment will be described with reference to the accompanying drawings.

First Embodiment

Figure 1:
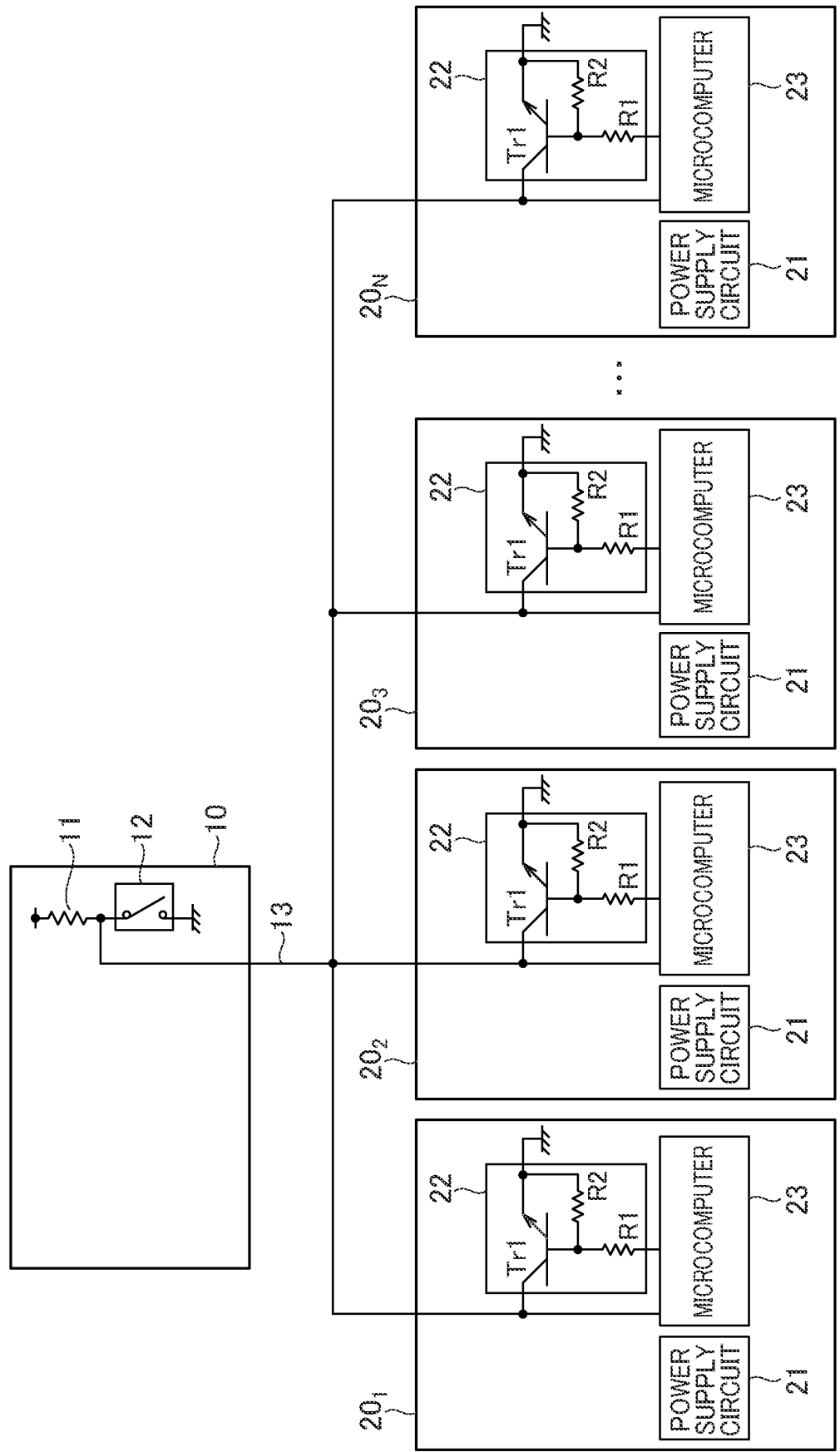
FIG. 1 is a block diagram illustrating an electronic device and an electronic device system according to a first embodiment.

In FIG. 1, N electronic devices $20_1$ to $20_N$ are connected to a control device 10. Any electronic device that is not specified as being any of the electronic devices $20_1$ to $20_N$ will be referred to as an electronic device 20. At least two electronic devices 20 may be connected to the control device 10.

The control device 10 includes a control switch 12 for turning on the power of the electronic devices $20_1$ to $20_N$. A resistor 11 is connected to one end of the control switch 12, and the other end is grounded. A predetermined voltage is supplied to the resistor 11. The electronic device 20 includes a power supply circuit 21, a hold circuit 22, and a microcomputer 23.

The hold circuit 22 includes an NPN transistor Tr1 (hereinafter, transistor Tr1), and resistors R1 and R2. The collector of the transistor Tr1 is connected to a power control line 13 from the control device 10 and the microcomputer 23, and the base is connected to the microcomputer 23 via the resistor R1. The resistor R2 is connected between the base and the emitter of the transistor Tr1, and the emitter is grounded. The power control line 13 is connected to one end of the control switch 12 and is connected to the microcomputer 23. The control device 10 controls the turning on of the power of the electronic device 20 by supplying a voltage to the power control line 13.

Figure 2:
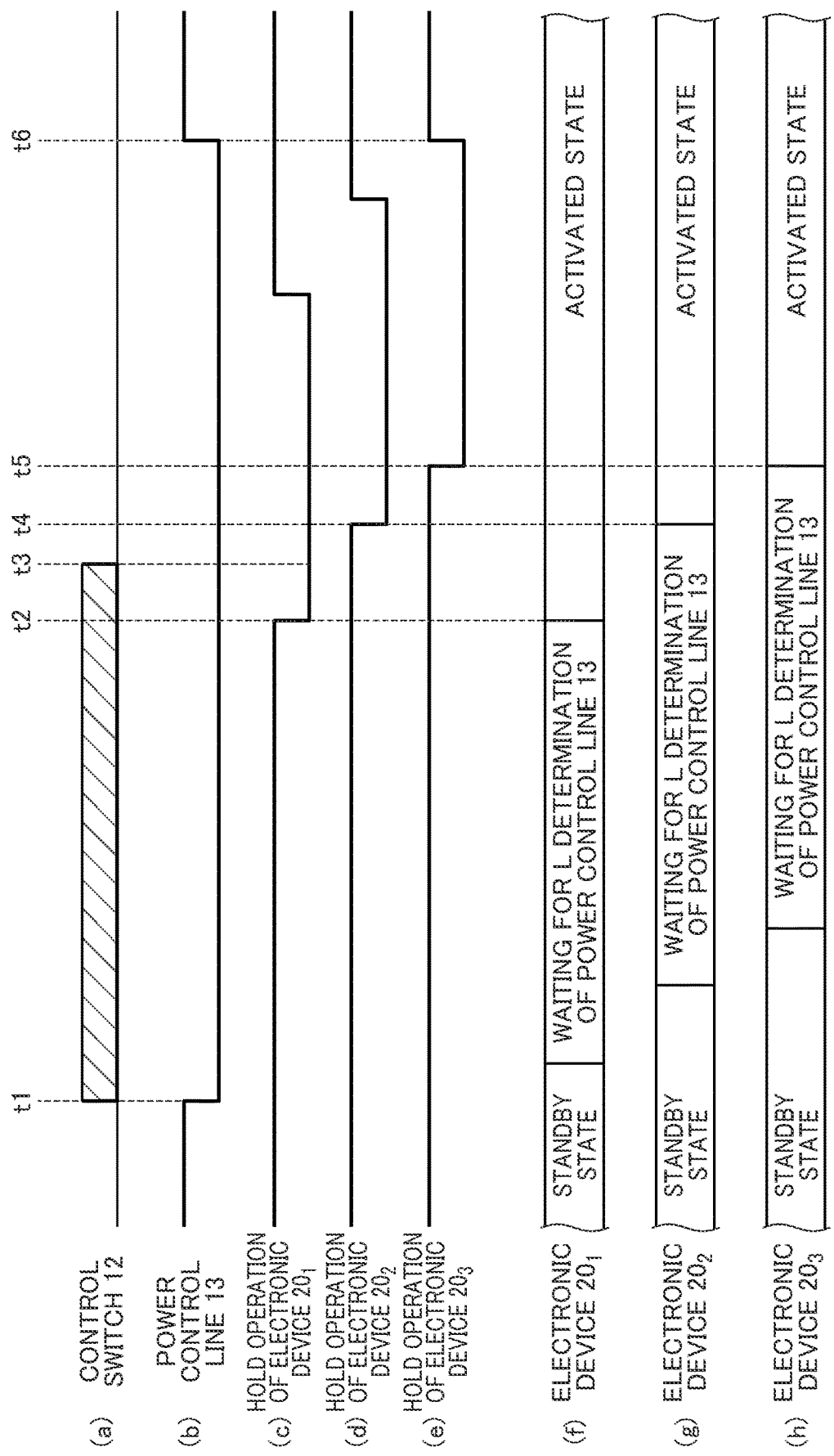
FIG. 2 is a timing chart illustrating an example of the operation of the electronic device and the electronic device system according to a first embodiment.

By using the timing chart shown in FIG. 2, an example of the operation of the control device 10 and the electronic devices $20_1$ to $20_3$ will be described. In FIG. 2, the case where three electronic devices 20 are connected to the control device 10 is taken as an example.

As shown in (a) of FIG. 2, it is assumed that the user presses the control switch 12 at time t1. Since the electronic device 20 is configured to turn itself on when the control switch 12 is pressed and held for a first predetermined time or longer, the user presses and holds the control switch 12 for the time from time t1 to time t3, to which hatching has been applied.

As shown in (b) of FIG. 2, when the user presses the control switch 12 at time t1, the power control line 13 that has been high (hereinafter, H) due to the supply of a predetermined voltage becomes low (hereinafter, L). The power control line 13 maintains the L state while the user presses and holds the control switch 12.

As shown in (f) to (h) of FIG. 2, the electronic devices $20_1$ to $20_3$ are in a standby state before the power is turned on. When the power control line 13 becomes L due to the control switch 12 being pressed, each of the microcomputers 23 of the electronic devices $20_1$ to $20_3$ starts measuring the time of the L state of the power control line 13. The clock in each electronic device 20 varies, and the time when the electronic devices $20_1$ to $20_3$ start measuring the time in the L state of the power control line 13 may also vary. The variation of the clock includes variations of each element including the crystal oscillator.

Here, it is assumed that the microcomputer 23 of the electronic device $20_1$ starts measuring the time of the L state of the power control line 13 immediately after time t1. It is assumed that next the microcomputer 23 of the electronic device $20_2$ starts measuring the time of the L state of the power control line 13, and finally the microcomputer 23 of the electronic device $20_3$ starts measuring the time of the L state of the power control line 13.

The microcomputer 23 of the electronic device $20_1$ has measured the L state of the power control line 13 for the first predetermined time at time t2, and controls the power supply circuit 21 to turn on the power to transition the electronic device $20_1$ to an activated state. In conjunction with this, the microcomputer 23 of the electronic device $20_1$ supplies a predetermined voltage to the base of the transistor Tr1 via the resistor R1 at time t2 to bring the base into the H state for a second predetermined time. The second predetermined time may be shorter than the first predetermined time.

Since the collector and the emitter become conductive when the base of the transistor Tr1 is in the H state, as shown in (c) of FIG. 2, the hold circuit 22 of the electronic device $20_1$ enters a hold state for maintaining the power control line 13 in the L state. The hold state in which the hold circuit 22 maintains the power control line 13 in the L state is a state in which the hold circuit 22 is operating.

The microcomputer 23 of the electronic device $20_2$ has measured the L state of the power control line 13 for the first predetermined time at time t4, and controls the power supply circuit 21 to turn on the power to transition the electronic device $20_2$ to the activated state. At time t4, the microcomputer 23 of the electronic device $20_2$ supplies a predetermined voltage to the base of the transistor Tr1 via the resistor R1 to bring the base into the H state for the second predetermined time. Then, as shown in (d) of FIG. 2, the hold circuit 22 of the electronic device $20_2$ enters the hold state that maintains the power control line 13 in the L state.

The microcomputer 23 of the electronic device $20_3$ has measured the L state of the power control line 13 for the first predetermined time at time t5, and controls the power supply circuit 21 to turn on the power to transition the electronic device $20_3$ to the activated state. At time t5, the microcomputer 23 of the electronic device $20_3$ supplies a predetermined voltage to the base of the transistor Tr1 via the resistor R1 to bring the base into the H state for the second predetermined time. Then, as shown in (e) of FIG. 2, the hold circuit 22 of the electronic device $20_3$ enters the hold state that maintains the power control line 13 in the L state.

If the electronic devices $20_1$ to $20_3$ were not equipped with the hold circuit 22, the power control line 13 would be in the H state when the user releases the control switch 12 at time t3. In the example shown in FIG. 2, since the microcomputers 23 of the electronic devices $20_2$ and $20_3$ have not completed the measurement of the first predetermined time of the L state of the power control line 13 at time t3, the microcomputers 23 will not transition the electronic devices $20_2$ and $20_3$ to the activated state.

Since the electronic devices $20_1$ to $20_3$ include the hold circuit 22, the power control line 13 finally enters the H state at time t6 when the second predetermined time has elapsed from the time when the microcomputer 23 of the electronic devices $20_3$ brought the base of the transistor Tr1 into the H state at time t5. The power control line 13 is continuously maintained in the L state even after time t3 when the user releases the control switch 12. Therefore, the microcomputers 23 of the electronic devices $20_2$ and $20_3$ complete the measurement of the first predetermined time of the L state of the power control line 13 at times t4 and t5, respectively, and can transition the electronic devices $20_2$ and $20_3$ to the activated state.

The second predetermined time for maintaining the power control line 13 in the L state by means of the hold circuit 22 after the microcomputer 23 of the electronic device 20 measures the first predetermined time may be a time that takes into consideration the variation of the clocks in the electronic devices 20. The second predetermined time may be a time longer than the maximum variation time in the variation of all the clocks of the N electronic devices 20.

Figure 3:
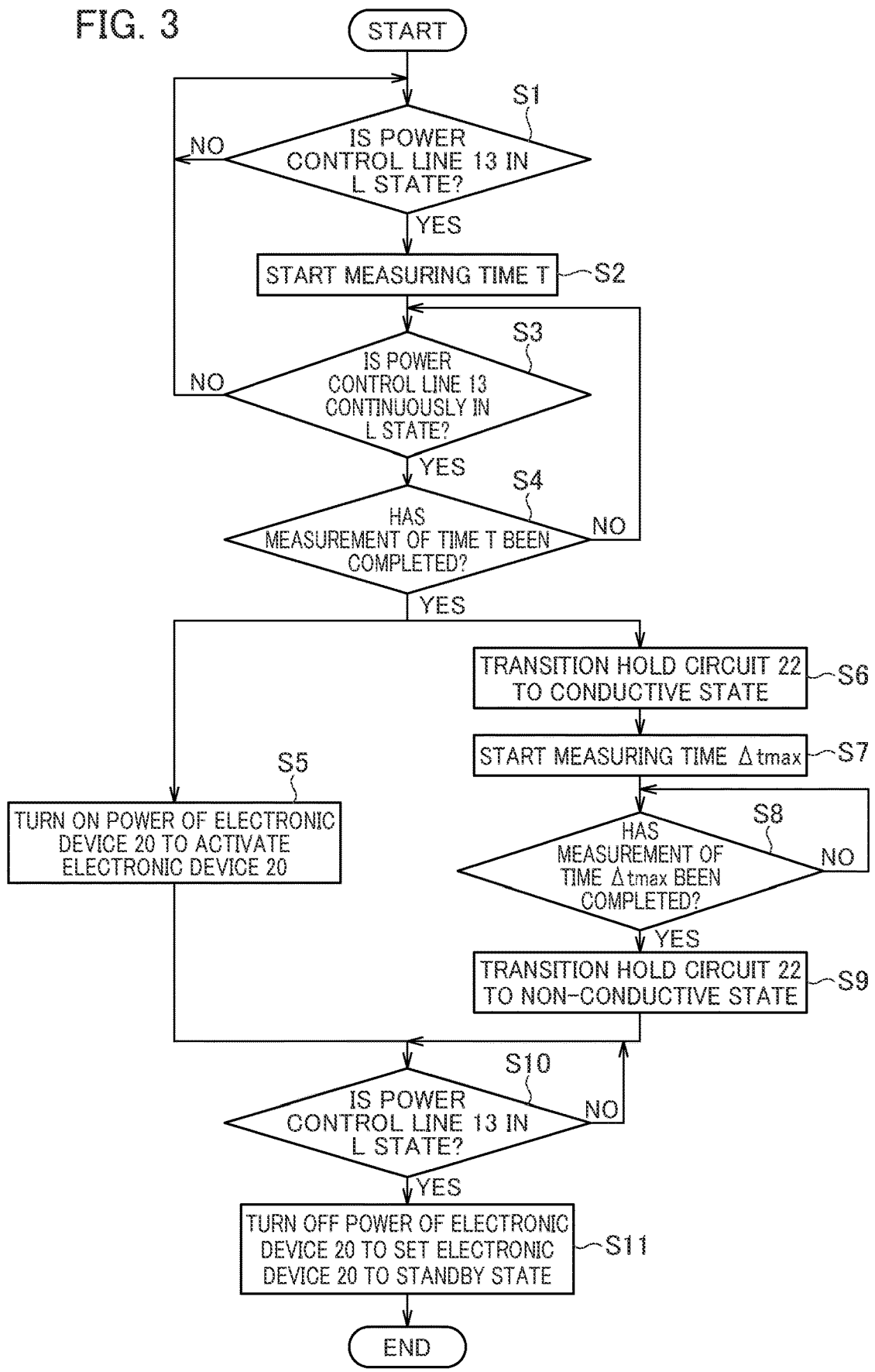
FIG. 3 is a flowchart illustrating processes executed by a microcomputer equipped with the electronic device according to a first embodiment.

Using the flowchart shown in FIG. 3, the processes executed by the microcomputer 23 of each electronic device 20 will be described. In FIG. 3, when the processing is started, the microcomputer 23 determines in step S1 whether or not the power control line 13 is in the L state due to the control switch 12 being pressed. If the power control line 13 is not in the L state (NO), the microcomputer 23 repeats the process of step S1. If the power control line 13 is in the L state (YES), the microcomputer 23 starts measuring the time T, which is the first predetermined time, in step S2.

In step S3, the microcomputer 23 determines whether or not the power control line 13 is continuously in the L state. If the power control line 13 is not continuously in the L state (NO) (that is, if the power control line 13 enters the H state), the microcomputer 23 returns the process to step S1. If the power control line 13 is continuously in the L state (YES), the microcomputer 23 determines whether or not the measurement of the time T has been completed in step S4. If the measurement of the time T has not been completed (NO), the microcomputer 23 returns the process to step S3.

If the measurement of the time T has been completed (YES) in step S4, the microcomputer 23 performs control to turn on the power of the electronic device 20 to activate the electronic device 20 in step S5, and transitions the process to step S10. In addition, in step S6, the microprocessor 23 sets the base of the transistor Tr1 to the H state and transitions the hold circuit 22 to a conductive state. Subsequently, the microcomputer 23 starts measuring the time Δtmax, which is the second predetermined time, in step S7.

In step S8, the microcomputer 23 determines whether or not the measurement of the time Δtmax has been completed. If the measurement of the time Δtmax has not been completed (NO), the microcomputer 23 repeats the process of step S8. If the measurement of the time Δtmax has been completed (YES), the microprocessor 23 sets the base of the transistor Tr1 to the L state and transitions the hold circuit 22 to the non-conductive state in step S9, and transitions the process to step S10.

In step S10, the microcomputer 23 determines whether or not the power control line 13 is in the L state due to the control switch 12 being pressed. In step S10, it is determined whether or not an instruction has been given to turn off the power of each electronic device 20 in the activated state. If the power control line 13 is not in the L state (NO), the microcomputer 23 repeats the process of step S10. If the power control line 13 is in the L state (YES), the microcomputer 23 turns off the power of the electronic device 20 to set the electronic device 20 to the standby state in step S11, and ends the processing.

Even when turning off the power of the electronic device 20 in the activated state, the microcomputer 23 may execute the process of step S11 if the control switch 12 is pressed and held for the first predetermined time or longer. In this case, the microcomputer 23 may execute the same processes as in steps S2 to S4 after step S10.

In accordance with the electronic device 20 and the electronic device system according to a first embodiment, by pressing and holding the control switch 12 provided in the control device 10 commonly connected to the plurality of electronic devices 20, the power of each electronic device 20 can be turned on more reliably. Accordingly, in accordance with the electronic device 20 and the electronic device system according to a first embodiment, the power of all the electronic devices 20 can be turned on more reliably.

Second Embodiment

Figure 4:
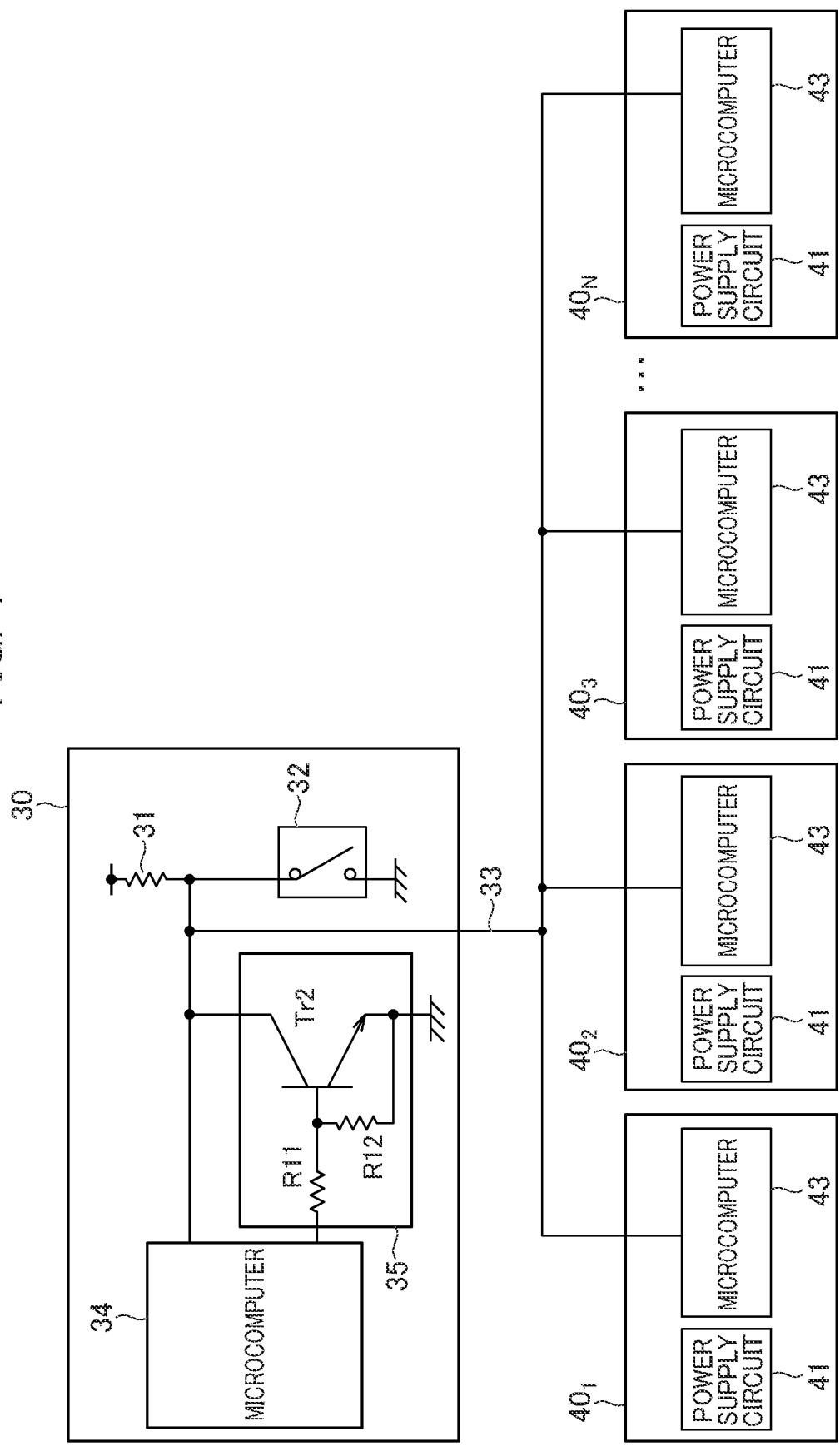
FIG. 4 is a block diagram illustrating an electronic device and an electronic device system according to a second embodiment.

In FIG. 4, N electronic devices $40_1$ to $40_N$ are connected to a control device 30. Any electronic device that is not specified as being any of the electronic devices $40_1$ to $40_N$ will be referred to as an electronic device 40. At least two electronic devices 40 may be connected to the control device 30.

The control device 30 includes a control switch 32 for turning on the power of the electronic devices $40_1$ to $40_N$. A resistor 31 is connected to one end of the control switch 32, and the other end is grounded. A predetermined voltage is supplied to the resistor 31. Moreover, the electronic device 30 includes a microcomputer 34 (a first microcomputer) and a hold circuit 35.

The hold circuit 35 includes an NPN transistor Tr2 (hereinafter, transistor Tr2), and resistors R11 and R12. The collector of the transistor Tr2 is connected to the one end of the control switch 32, a power control line 33, and the microcomputer 34, and the base is connected to the microcomputer 34 via the resistor R11. The resistor R12 is connected between the base and the emitter of the transistor Tr2, and the emitter is grounded. The power control line 33 is connected to the one end of the control switch 32 and is connected to the microcomputer 34.

The electronic devices 40 includes a power supply circuit 41 and a microcomputer 43 (a second microcomputer). The electronic device 40 does not have to include a hold circuit.

Figure 5:
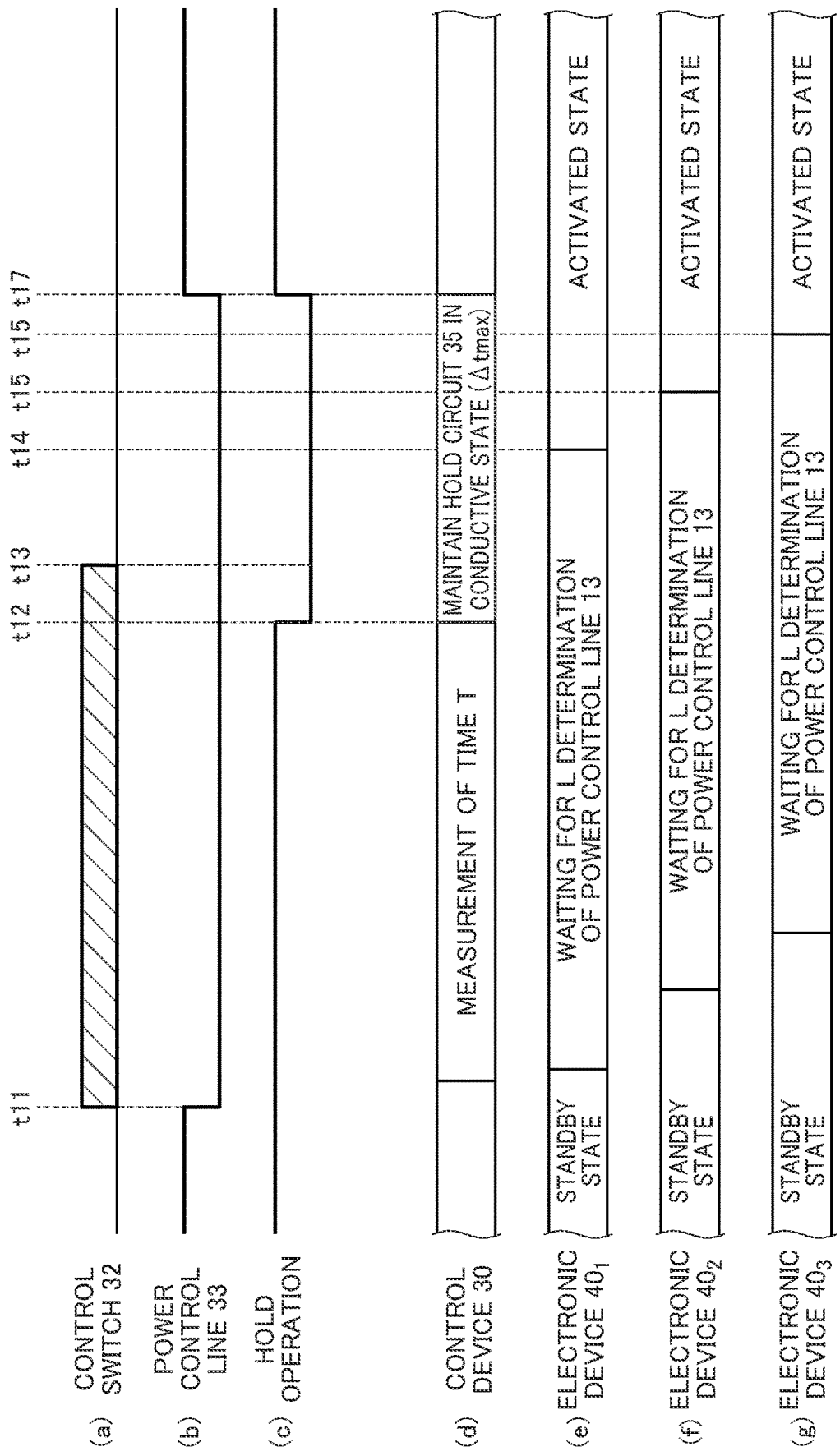
FIG. 5 is a timing chart illustrating an example of the operation of the electronic device and the electronic device system according to a second embodiment.

By using the timing chart shown in FIG. 5, an example of the operation of the control device 30 and the electronic devices $40_1$ to $40_3$ will be described. In FIG. 5, the case where three electronic devices 40 are connected to the control device 30 is taken as an example.

As shown in (a) of FIG. 5, it is assumed that the user presses the control switch 32 at time t11. Since the electronic devices 40 are configured to turn themselves on when the control switch 32 is pressed and held for a first predetermined time or longer, the user presses and holds the control switch 32 for the time from time t11 to time t13, to which hatching has been applied.

As shown in (b) of FIG. 5, when the user presses the control switch 32 at time t11, the power control line 33 that has been H due to the supply of a predetermined voltage becomes L. The power control line 33 maintains the L state while the user presses and holds the control switch 32.

As shown in (d) of FIG. 5, when the power control line 33 becomes L due to the control switch 32 being pressed, the microcomputer 34 starts measuring the time of the state L of the power control line 33 immediately after time t11. Due to the control switch 32 being continuously pressed, the microcomputer 34 has measured the L state of the power control line 33 for the first predetermined time (time T) at time t12.

Then, the microcomputer 34 supplies a predetermined voltage to the base of the transistor Tr2 via the resistor R11 to bring the base into the H state for the second predetermined time (time Δtmax). Since the collector and the emitter become conductive when the base of the transistor Tr2 is in the H state, as shown in (c) of FIG. 5, the hold circuit 35 enters a hold state for maintaining the power control line 33 in the L state. The hold state in which the hold circuit 35 maintains the power control line 33 in the L state is a state in which the hold circuit 35 is operating.

As shown in (d) of FIG. 5, the microcomputer 34 maintains the hold circuit 35 in a conductive state for the second predetermined time from time t12 to time t17. As shown in (c) of FIG. 5, the hold circuit 35 is in the hold state for the second predetermined time. As shown in (b) of FIG. 5, the power control line 33 maintains the L state by means of the hold operation by the hold circuit 35 until time t17 even after time t13 when the user releases the control switch 32.

As shown in (e) to (g) of FIG. 5, the electronic devices $40_1$ to $40_3$ are in a standby state before the power is turned on. When the power control line 33 becomes L due to the control switch 32 being pressed, each microcomputer 43 of the electronic devices $40_1$ to $40_3$ starts measuring the time of the L state of the power control line 33. Even here, it is assumed that the times when the electronic devices $40_1$ to $40_3$ start measuring the time of the L state of the power control line 33 vary.

Here, it is assumed that first the microcomputer 43 of the electronic device $40_1$ starts measuring the time of the L state of the power control line 33. It is assumed that next the microcomputer 43 of the electronic device $40_2$ starts measuring the time of the L state of the power control line 33, and finally the microcomputer 43 of the electronic device $40_3$ starts measuring the time of the L state of the power control line 33.

The microcomputer 43 of the electronic device $40_1$ has measured the L state of the power control line 33 for the first predetermined time at time t14, and controls the power supply circuit 41 to turn on the power to transition the electronic device $40_1$ to the activated state. The microcomputer 43 of the electronic device $40_2$ has measured the L state of the power control line 33 for the first predetermined time at time t15, and controls the power supply circuit 41 to turn on the power to transition the electronic device $40_2$ to the activated state. The microcomputer 43 of the electronic device $40_3$ has measured the L state of the power control line 33 for the first predetermined time at time t16, and controls the power supply circuit 41 to turn on the power to transition the electronic device $40_3$ to the activated state.

If the control device 30 were not equipped with the hold circuit 35, the power control line 33 would be in the H state when the user releases the control switch 32 at time t13. In the example shown in FIG. 5, since the microcomputers 43 of the electronic devices $40_1$ to $40_3$ have not completed the measurement of the first predetermined time of the L state of the power control line 33 at time t13, the microcomputers 43 do not transition the electronic devices $40_1$ to $40_3$ to the activated state.

Since the control device 30 includes the hold circuit 35, the power control line 33 is finally in the H state at time t17 when the microcomputer 34 releases the conductive state of the hold circuit 35 (transitions to the non-conductive state). Therefore, the microcomputers 43 of the electronic devices $40_1$ to $40_3$ can transition the electronic devices $40_1$ to $40_3$ to the activated state at times t14 to t16, respectively.

The second predetermined time for maintaining the power control line 33 in the L state by means of the hold circuit after the microcomputer 34 measures the first predetermined time may be a time that takes into consideration the variation of the clocks in the electronic devices 40. The second predetermined time may be a time longer than the maximum variation time in the variation of all the clocks of the N electronic devices 40.

Figure 6:
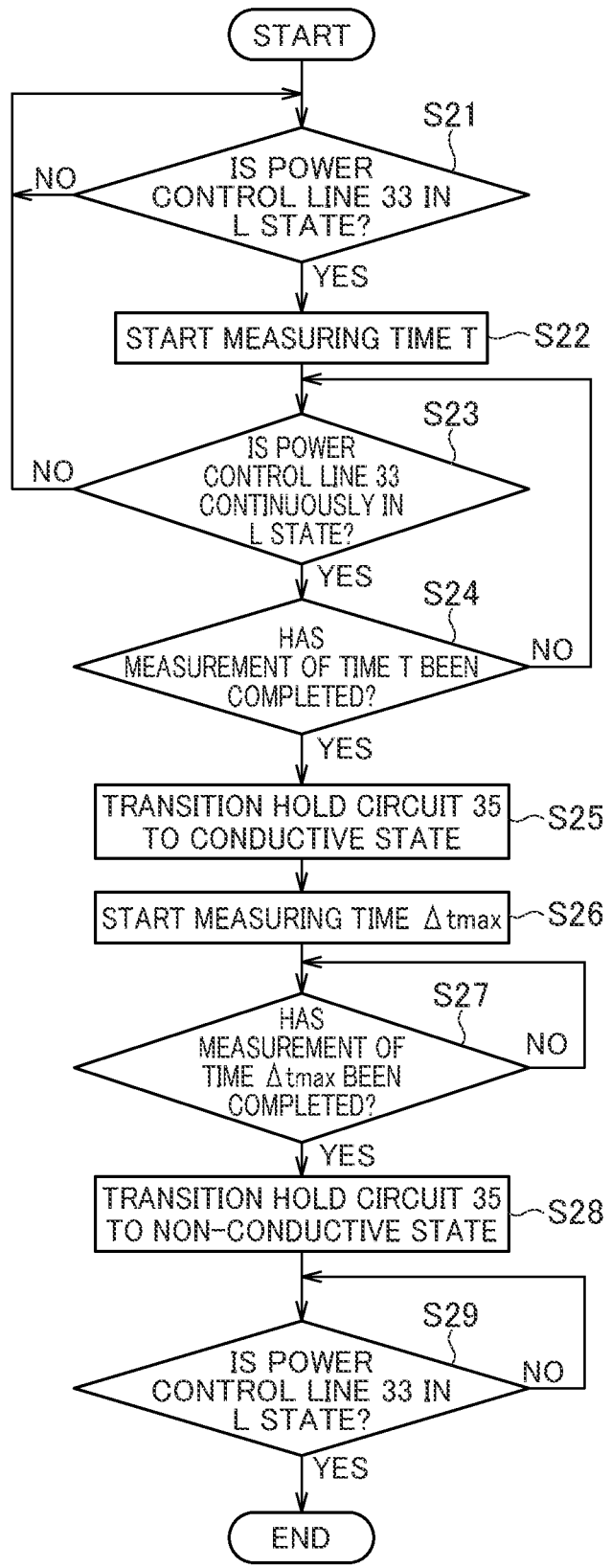
FIG. 6 is a flowchart illustrating processes executed by a microcomputer equipped with the electronic device according to a second embodiment.

Using the flowchart shown in FIG. 6, the processes executed by the microcomputer 34 of the control device 30 will be described. In FIG. 6, when the processing is started, the microcomputer 34 determines in step S21 whether or not the power control line 33 is in the L state due to the control switch 32 being pressed. If the power control line 33 is not in the L state (NO), the microcomputer 34 repeats the process of step S21. If the power control line 33 is in the L state (YES), the microcomputer 34 starts measuring the time T, which is the first predetermined time, in step 322.

In step S23, the microcomputer 34 determines whether or not the power control line 33 is continuously in the L state. If the power control line 33 is not continuously in the L state (NO) (that is, if it enters the H state), the microcomputer 34 returns the process to step S21. If the power control line 33 is continuously in the L state (YES), the microcomputer 34 determines whether or not the measurement of the time T has been completed in step S24. If the measurement of the time T has not been completed (NO), the microcomputer 34 returns the process to step S23.

If the measurement of the time T has been completed (YES) in step S24, the microcomputer 34 sets the base of the transistor Tr2 to the H state and transitions the hold circuit 35 to the conductive state in step S25. Subsequently, the microcomputer 34 starts measuring the time Δtmax, which is the second predetermined time, in step S26.

In step S27 the microcomputer 34 determines whether or not the measurement of the time Δtmax has been completed. If the measurement of the time Δtmax has not been completed (NO), the microcomputer 34 repeats the process of step S27. If the measurement of the time Δtmax has been completed (YES), the microprocessor 34 sets the base of the transistor Tr2 to the L state and transitions the hold circuit 35 to the non-conductive state in step S28, and transitions the process to step S29.

In step S29, the microcomputer 34 determines whether or not the power control line 33 is in the L state due to the control switch 32 being pressed. In step S29, it is determined whether or not an instruction has been given to turn off the power of each electronic device 40 in the activated state. If the power control line 33 is not in the L state (NO), the microcomputer 34 repeats the process of step S29. If the power control line 33 is in the L state (YES), the microcomputer 34 ends the processing.

The microcomputer 34 may end the processing when the control switch 32 is pressed and held for the first predetermined time or longer when turning off the power of the electronic devices 40 in the activated state. If the power control line 33 is in the L state for the first predetermined time or longer, the microcomputer 43 may turn off the power of the electronic devices 40 to transition to the standby state.

In accordance with the electronic device 40 and the electronic device system according to a second embodiment, by pressing and holding the control switch 32 provided in the control device 30 commonly connected to the plurality of electronic devices 40, the power of each electronic device 40 can be turned on more reliably. Accordingly, in accordance with the electronic device 40 and the electronic device system according to a second embodiment, the power of all the electronic devices 40 can be turned on more reliably. In accordance with the electronic device 40 and the electronic device system according to a second embodiment, since the hold circuit 35 may be provided only in the control device 30, an existing electronic device as it is can be used as the electronic device 40

Third Embodiment

The electronic device and the electronic device system according to a third embodiment have the same configuration as the electronic device 20 and the electronic device system shown in FIG. 1. Therefore, the electronic device according to a third embodiment will be referred to as an electronic device 20. In the electronic device 20 and the electronic device system according to a third embodiment, a description of the parts common with the electronic device 20 and the electronic device system according to a first embodiment will be omitted.

In a first embodiment, when the L state of the power control line 13 is measured for the first predetermined time, microcomputer 23 in each electronic device 20 controls the power supply circuit 21 to turn on the power to transition each electronic device 20 to the activated state. In the example shown in FIG. 2, as shown in (f) to (h), the time points at which the time measurement of the L state of the power control line 13 is started are different.

If the time point at which the microcomputer 23 starts measuring the time of the I state of the power control line 13 is almost the same in all the electronic devices 20, the power of all the electronic devices 20 is turned on almost at the same time. Then, inrush currents are generated at substantially the same time in all the electronic devices 20. A third embodiment is configured to prevent the inrush currents from being generated at substantially the same time.

Figure 7:
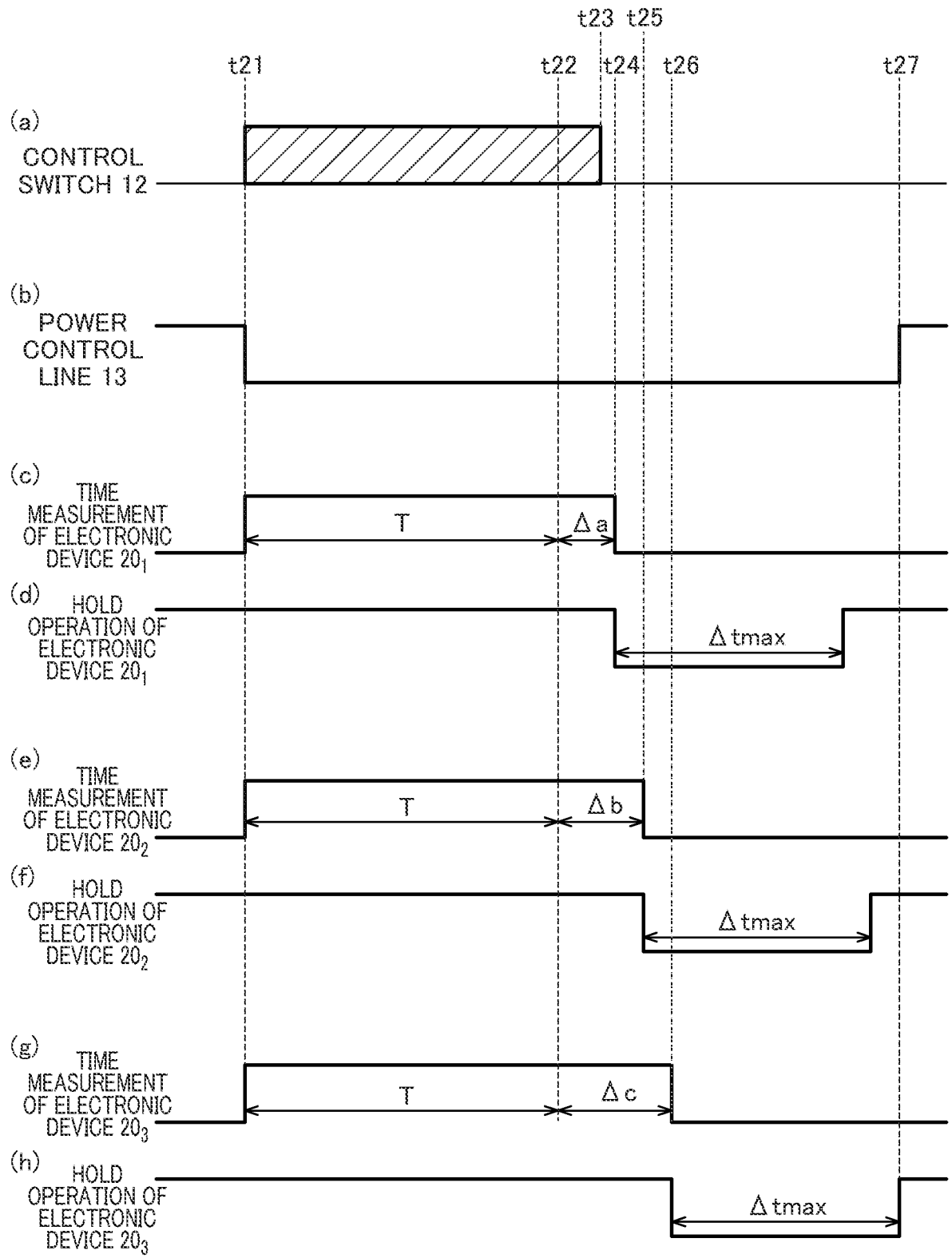
FIG. 7 is a timing chart illustrating an example of the operation of the electronic device and the electronic device system according to a third embodiment.

By using the timing chart shown in FIG. 7, an example of the operation of the control unit 10 and the electronic devices $20_1$ to $20_3$ will be described. In FIG. 7, the case where three electronic devices 20 are connected to the control device 10 is taken as an example.

As shown in (a) of FIG. 7, it is assumed that the user presses the control switch 12 at time t21 and holds it until time t23. In the example shown in FIG. 7, as shown in (c), (e), and (g), it is assumed that the microcomputers 23 of the electronic devices $20_1$ to $20_3$ start measuring the time T at almost the same time t21.

The microcomputer 23 of the electronic device $20_1$ measures the time "T+Δa" obtained by adding the time Δa up to time t24 to the time T, after time t22 at which the time T has elapsed. The microcomputer 23 of the electronic device $20_2$ measures the time "T+Δb" obtained by adding the time Δb up to time t25 to the time T. The microcomputer 23 of the electronic device $20_3$ measures the time "T+Δc" obtained by adding, the time Δc up to time t26 to the time T. The times Δa to Δc are different times from one another. The time Δa may be 0, and the times Δb and Δc may be a time exceeding 0. In this case, the times Δd and Δc are different times from each other.

In this way, the N electronic devices 20 do not measure a common first predetermined time, but the N electronic devices 20 measure first predetermined times different from one another. In a third embodiment, the first predetermined time may be the time "T+Δa", the time "T+Δb", or the time "T+Δc". In a third embodiment, the first predetermined time may be yet another time.

Note that it preferable to measure first predetermined times different from one another in all of the N electronic devices 20, but some of the electronic devices may measure a common first predetermined time. Each microcomputer 23 of at least two electronic devices 20 in the N electronic devices 20 may set the first predetermined time to different times from each other. Preferably, each microcomputer 23 of the N electronic devices 20 sets the first predetermined time to different times from one another.

As shown in (d), (f), and (h) of FIG. 7, the microcomputers 23 of the electronic devices $20_1$ to $20_3$ operate the hold circuits 22 for the time Δtmax, which is the second predetermined time, from time t24, from time t25, and from time t26, respectively. As shown in (b) of FIG. 7, the power control line 13 maintains the low state until time t27, and then enters the H state.

According to a third embodiment, in addition to the effect of a first embodiment, it is possible to stagger the timing at which the inrush current is generated when the power is turned on in the plurality of electronic devices 20. This will reduce the risk of failures and other problems caused by inrush currents in the plurality of electronic devices 20.

Fourth Embodiment

The electronic device and the electronic device system according to a fourth embodiment have the same configuration as the electronic device 40 and the electronic device system shown in FIG. 4. Therefore, the electronic device according to a fourth embodiment will be referred to as an electronic device 40. In the electronic device 40 and the electronic device system according to a fourth embodiment, a description of the parts common with the electronic device 40 and the electronic device system according to a second embodiment will be omitted.

In a second embodiment, when the L state of the power control line 33 is measured for the first predetermined time, the microcomputer 43 in each electronic device 40 controls the power supply circuit 41 to turn on the power to transition each electronic device 40 to the activated state. In the example shown in FIG. 5, as shown in (e) to (g), the time points at which the time measurement of the L state of the power control line 33 is started are different.

Also in FIG. 4, if the time point at which the microcomputer 43 starts measuring the time of the L state of the power control line 33 is almost the same in all the electronic devices 40, the power of all the electronic devices 40 is turned on almost at the same time. Then, inrush currents are generated at substantially the same time in all the electronic devices 40. A fourth embodiment is configured to prevent the inrush currents from being generated at substantially the same time.

By using the timing chart shown in FIG. 8, an example of the operation of the control unit 30 and the electronic devices $40_1$ to $40_3$ will be described. In FIG. 8, the case where three electronic devices 40 are connected to the control device 30 is taken as an example.

As shown in (a) of FIG. 8, it is assumed that the user presses the control switch 32 at time t31 and holds it until time t33. In the example shown in FIG. 8, as shown in (d) to (f), it is assumed that the microcomputers 43 of the electronic devices $40_1$ to $40_3$ start measuring the time T at almost the same time t31.

The microcomputer 43 of the electronic device $40_1$ measures the time "T+Δa" obtained by adding the time Δa up to time t34 to the time T, after time t32 at which the time T has elapsed. The microcomputer 43 of the electronic device $40_2$ measures the time "T+Δb" obtained by adding the time Δb up to time t35 to the time T. The microcomputer 43 of the electronic device $40_3$ measures the time "T+Δc" obtained by adding the time Δc up to time t36 to the time T. The times Δa to Δc are the same as those in a third embodiment.

In this way, the N electronic devices 40 do not measure a common first predetermined time, but the N electronic devices 40 measure first predetermined times different from one another. In a fourth embodiment, the first predetermined time may be the time "T+Δa", the time "T+Δb", or the time "T+Δc". In a fourth embodiment, the first predetermined time may be yet another time.

Also in a fourth embodiment, it is preferable to measure first predetermined times different from one another in all of the N electronic devices 40, but some of the electronic devices 40 may measure a common first predetermined time. Each microcomputer 43 of at least two electronic devices 40 in the N electronic devices 40 may set the first predetermined time to different times from each other. Preferably, each microcomputer 43 of the N electronic devices 40 sets the first predetermined time to different times from one another.

As shown in (c) of FIG. 8, the microcomputer 34 of the control device 30 operates the hold circuit 35 for the time Δtmax, which is the second predetermined time, from time t32 to time t37. As shown in (b) of FIG. 8, the power control line 33 maintains the low state until time t37, and then enters the H state.

According to a fourth embodiment, in addition to the effect of a second embodiment, it is possible to stagger the timing at which the inrush current is generated when the power is turned on in the plurality of electronic devices 40. This will reduce the risk of failures and other problems caused by inrush currents in the plurality of electronic devices 40.

The present invention is not limited to first to fourth embodiments described above, and various modifications can be made without departing from the scope of the present invention. In first to fourth embodiments, when the control switch 12 or 32 is pressed, the power control line 13 or 33 transitions from a high state (first state) to a low state (second state). The microcomputer 23 or 34 operates the hold circuit 22 or 35 so as to maintain the power control line 13 or 33, which is in the low state after the lapse of the first predetermined time, in the low state for the second predetermined time.

The electronic devices and the electronic device system may be configured such that when the control switch 12 or 32 is pressed, the power control line 13 or 33 transitions from a low state (first state) to a high state (second state). In this case, the microcomputer 23 or 34 may operate the hold circuit 22 or 35 to maintain the power control line 13 or 33, which has been in the high state after the lapse of the first predetermined time, in the high state for the second predetermined time.

What is claimed is:

1. An electronic device system comprising:
   a plurality of electronic devices; and
   a control device connected to the plurality of electronic devices by a power control line, and comprising a control switch for transitioning the power control line from a first state to a second state,
   wherein each electronic device of the plurality of electronic devices comprises:
   a power supply circuit;
   a hold circuit connected to the power control line; and
   a microcomputer configured to start measuring a time of the second state when the power control line transitions from the first state to the second state responsive to pressing of the power switch, to control the power supply circuit to turn on power when the second state continues for a first predetermined time, and to operate the hold circuit to maintain the power control line in the second state for a second predetermined time after the first predetermined time has elapsed, in which a time when the plurality of electronic devices start measuring the time of the second state may vary due to clock variations in each electronic device, and the second redetermined time is set to a time longer than a maximum variation time in the variation of the time to start measuring the time of the second state.

2. The electronic device system according to claim 1, wherein the microcomputers of at least two electronic devices in the plurality of electronic devices set the first predetermined time to different times from each other.

3. An electronic device system comprising:
   a plurality of electronic devices; and
   a control device connected to the plurality of electronic devices by a power control line, wherein the control device comprises:
   a control switch for transitioning the power control line from a first state to a second state;
   a hold circuit connected to the power control line; and
   a first microcomputer configured to start measuring a time of the second state when the power control line transitions from the first state to the second state responsive to pressing the control switch, and, when the second state continues for a first predetermined time, to operate the hold circuit to maintain the power control line in the second state for a second predetermined time after the first predetermined time has elapsed, and each electronic device of tie plurality of electronic devices comprises:
   a power supply circuit;
   a second microcomputer configured to start measuring a time of the second state when the power control line transitions from the first state to the second state, and to control the power, supply circuit to turn on power after the first predetermined time has elapsed, in which a time when the plurality of electronic devices start measuring the time of the second state may vary due to clock variations in each electronic device, and the second predetermined time is set to a time longer than a maximum variation time in the variation of the time to start measuring the time of the second state.

4. The electronic device system according to claim 3, wherein the second microcomputers of at least two electronic devices in the plurality of electronic devices set the first predetermined time to different times from each other.

* * * * *

UNITED STATES PATENT AND TRADEMARK OFFICE
CERTIFICATE OF CORRECTION

| | |
|---|---|
| PATENT NO. | : 11,847,004 B2 |
| APPLICATION NO. | : 17/752593 |
| DATED | : December 19, 2023 |
| INVENTOR(S) | : Hirofumi Otakeguchi |

It is certified that error appears in the above-identified patent and that said Letters Patent is hereby corrected as shown below:

In the Claims

Claim 3, Column 12, Line 35, delete the phrase "to control the power, supply circuit" and replace with "to control the power supply circuit".

Signed and Sealed this
Thirteenth Day of February, 2024

*Katherine Kelly Vidal*

Katherine Kelly Vidal
*Director of the United States Patent and Trademark Office*